United States Patent
Affinito et al.

(10) Patent No.: US 6,656,537 B2
(45) Date of Patent: *Dec. 2, 2003

(54) PLASMA ENHANCED CHEMICAL DEPOSITION WITH LOW VAPOR PRESSURE COMPOUNDS

(75) Inventors: John D. Affinito, Tucson, AZ (US); Gordon L. Graff, West Richland, WA (US); Peter M. Martin, Kennewick, WA (US); Mark E. Gross, Pasco, WA (US); Eric Mast, Richland, WA (US); Michael G. Hall, West Richland, WA (US)

(73) Assignee: Battelle Memorial Institute, Richland, WA (US)

(*) Notice: Subject to any disclaimer, the term of this patent is extended or adjusted under 35 U.S.C. 154(b) by 164 days.

This patent is subject to a terminal disclaimer.

(21) Appl. No.: 09/811,874

(22) Filed: Mar. 19, 2001

(65) Prior Publication Data

US 2002/0172778 A1 Nov. 21, 2002

Related U.S. Application Data

(63) Continuation-in-part of application No. 08/939,594, filed on Sep. 29, 1997, now Pat. No. 6,224,948.

(51) Int. Cl.[7] ............................................. C23C 16/50
(52) U.S. Cl. .................. 427/488; 427/497; 427/506; 427/508; 427/509; 427/520; 427/562; 427/569; 427/255.6
(58) Field of Search ................... 427/488, 497, 427/506, 507, 509, 520, 562, 569, 255.6

(56) References Cited

U.S. PATENT DOCUMENTS

3,475,307 A * 10/1969 Knox et al. ................. 204/168
3,607,365 A   9/1971 Lindlof (List continued on next page.)

FOREIGN PATENT DOCUMENTS

| BE | 704 297 | 2/1968 |
|---|---|---|
| DE | 19603746 | 4/1997 |
| EP | 0 299 753 | 1/1989 |
| EP | 0 340 935 | 11/1989 |
| EP | 0 390 540 | 10/1990 |
| EP | 0 547 550 | 6/1993 |
| EP | 0 590 467 | 4/1994 |
| EP | 0 722 787 | 7/1996 |
| EP | 0 787 826 | 8/1997 |
| EP | 0 916 394 | 5/1999 |
| EP | 0 931 850 | 7/1999 |
| EP | 0 977 469 | 2/2000 |
| JP | 63136316 | 6/1988 |

(List continued on next page.)

OTHER PUBLICATIONS

Mahon, J.K., et al., Requirements of Flexible Substrates for Organic Light Emitting Devices in Flat Panel Display Applications, Society of Vacuum Coaters, 42nd Annual Technical Conference Proceedings, Oct. 1999, pp. 456–459.

(List continued on next page.)

Primary Examiner—Timothy Meeks
(74) Attorney, Agent, or Firm—Dinsmore & Shohl LLP

(57) ABSTRACT

A method for plasma enhanced chemical vapor deposition of low vapor monomeric materials. The method includes flash evaporating a polymer precursor forming an evaporate, passing the evaporate to a glow discharge electrode creating a glow discharge polymer precursor plasma from the evaporate, and cryocondensing the glow discharge polymer precursor on a substrate as a cryocondensed polymer precursor layer, and crosslinking the cryocondensed polymer precursor layer thereon, the crosslinking resulting from radicals created in the glow discharge polymer precursor plasma.

24 Claims, 3 Drawing Sheets

U.S. PATENT DOCUMENTS

| | | | |
|---|---|---|---|
| 4,098,965 A | | 7/1978 | Kinsman |
| 4,283,482 A | | 8/1981 | Hattori et al. |
| 4,581,337 A | | 4/1986 | Frey et al. |
| 4,624,867 A | | 11/1986 | Iijima et al. |
| 4,695,618 A | | 9/1987 | Mowrer |
| 4,842,893 A | | 6/1989 | Yializis et al. |
| 4,954,371 A | * | 9/1990 | Yializis ...................... 427/497 |
| 5,032,461 A | | 7/1991 | Shaw et al. |
| 5,204,314 A | | 4/1993 | Kirlin et al. |
| 5,237,439 A | | 8/1993 | Misono et al. |
| 5,260,095 A | | 11/1993 | Affinito |
| 5,354,497 A | | 10/1994 | Fukuchi et al. |
| 5,395,644 A | | 3/1995 | Affinito |
| 5,427,638 A | | 6/1995 | Goetz et al. |
| 5,440,446 A | | 8/1995 | Shaw et al. |
| 5,536,323 A | | 7/1996 | Kirlin et al. |
| 5,547,508 A | | 8/1996 | Affinito |
| 5,554,220 A | | 9/1996 | Forrest et al. |
| 5,576,101 A | | 11/1996 | Saitoh et al. |
| 5,607,789 A | | 3/1997 | Treger et al. |
| 5,620,524 A | | 4/1997 | Fan et al. |
| 5,629,389 A | | 5/1997 | Roitman et al. |
| 5,652,192 A | | 7/1997 | Matson et al. |
| 5,654,084 A | | 8/1997 | Egert |
| 5,665,280 A | | 9/1997 | Tropsha |
| 5,681,615 A | | 10/1997 | Affinito et al. |
| 5,681,666 A | | 10/1997 | Treger et al. |
| 5,684,084 A | | 11/1997 | Lewin et al. |
| 5,686,360 A | | 11/1997 | Harvey, III et al. |
| 5,693,956 A | | 12/1997 | Shi et al. |
| 5,711,816 A | | 1/1998 | Kirlin et al. |
| 5,725,909 A | | 3/1998 | Shaw et al. |
| 5,731,661 A | | 3/1998 | So et al. |
| 5,747,182 A | | 5/1998 | Friend et al. |
| 5,757,126 A | | 5/1998 | Harvey, III et al. |
| 5,759,329 A | | 6/1998 | Krause et al. |
| 5,792,550 A | | 8/1998 | Phillips et al. |
| 5,811,177 A | | 9/1998 | Shi et al. |
| 5,811,183 A | | 9/1998 | Shaw et al. |
| 5,821,692 A | | 10/1998 | Rogers et al. |
| 5,844,363 A | | 12/1998 | Gu et al. |
| 5,872,355 A | | 2/1999 | Hueschen |
| 5,902,641 A | | 5/1999 | Affinito et al. |
| 5,902,688 A | | 5/1999 | Antoniadis et al. |
| 5,904,958 A | | 5/1999 | Dick et al. |
| 5,912,069 A | | 6/1999 | Yializis et al. |
| 5,919,328 A | | 7/1999 | Tropsha et al. |
| 5,922,161 A | | 7/1999 | Wu et al. |
| 5,945,174 A | | 8/1999 | Shaw et al. |
| 5,948,552 A | | 9/1999 | Antoniadis et al. |
| 5,955,161 A | | 9/1999 | Tropsha |
| 5,965,907 A | | 10/1999 | Huang et al. |
| 5,968,620 A | | 10/1999 | Harvey et al. |
| 5,996,498 A | | 12/1999 | Lewis |
| 6,013,337 A | | 1/2000 | Knors |
| 6,045,864 A | | 4/2000 | Lyons et al. |
| 6,083,628 A | | 7/2000 | Yializis |
| 6,092,269 A | | 7/2000 | Yializis et al. |
| 6,106,627 A | | 8/2000 | Yializis |
| 6,146,225 A | | 11/2000 | Sheats et al. |
| 6,165,566 A | | 12/2000 | Tropsha |
| 6,207,239 B1 | * | 3/2001 | Affinito ...................... 427/488 |
| 6,214,422 B1 | | 4/2001 | Yializis |
| 6,224,948 B1 | * | 5/2001 | Affinito ...................... 427/488 |
| 6,231,939 B1 | | 5/2001 | Shaw et al. |

FOREIGN PATENT DOCUMENTS

| | | |
|---|---|---|
| JP | 64-18441 | 1/1989 |
| JP | 2-183230 | 7/1990 |
| JP | 08325713 | 12/1996 |
| JP | 09059763 | 3/1997 |
| WO | WO 87 07848 | 12/1987 |
| WO | WO 95 10117 | 4/1995 |
| WO | WO 97 04885 | 2/1997 |
| WO | WO 97 22631 | 6/1997 |
| WO | WO 98 10116 | 3/1998 |
| WO | WO 98 18852 | 5/1998 |
| WO | WO 99 16557 | 4/1999 |
| WO | WO 99 16931 | 4/1999 |

OTHER PUBLICATIONS

Affinito, J.D. et al., "Molecularly Doped Polymer Composite Films for Light Emitting Polymer Applications Fabricated by the PML Process" 1998 Society of Vaccum Coaters, 41st Annual Technical Conference Proceedings (1998), pp. 220–225.

Shi, M.K., et al., Plasma treatment of PET and acrylic coating surfaces–I. In situ XPS measurements, Journal of Adhesion Science and Technology, Mar. 2000, 14(12), pp. 1–28.

Shi, M.K., et al., In situ and real–time monitoring of plasma–induced etching PET and acrylic films, Plasmas and Polymers, Dec. 1999, 4(4), pp. 1–25.

Affinito, J.D., et al., Vacuum Deposited Conductive Polymer Films, The Eleventh International Conference on Vacuum Web Coating, no earlier than Feb. 1998, pp. 200–213.

Mahon, J.K., et al., Requirements of Flexible Substrates for Organic Light Emitting Devices in Flat Panel Display Applications, Society of Vacuum Coaters, 42nd Annual Technical Conference Proceedings, 1999, pp. 456–459.

Affinito, J.D., et al., "Vacuum Deposition of Polymer Electrolytes on Flexible Substrates," "Proceedings of the Ninth International Conference on Vacuum Web Coating," Nov. 1995 ed R. Bakish, Bakish Press 1995, pp. 20–36.

Vossen, J.L., et al., Thin Film Processes, Academic Press, 1978, Part II, Chapter 11–1, Glow Discharge Sputter Deposition, p. 12–63; Part IV, Chapter IV–1, Plasma Deposition of Inorganic Compounds and Chapter IV–2 Glow Discharge Polymerization, p. 335–397.

Penning, F.M., Electrical Discharges in Gases, Gordon and Breach Science Publishers, 1965, Chapters 5–6, p. 19–35, and Chapter 8, p. 41–50.

Affinito, J.D., et al., "High Rate Vacuum Deposition of Polymer Electrolytes," Journal Vacuum Science Technology A 14(3), May/Jun. 1996.

Inoue et al., Fabrication of a Thin Film of MNA by Vapour Deposition, Proc. Jpn. Congr. Mater. Res., vol. 33, pp. 177–179, 1990.

Affinito, J.D. et al., "PML/Oxide/PML Barrier Layer Performance Differences Arising From Use of UV or Electron Beam Polymerization of the PML Layers," Thin Solid Films, Elsevier Science S.A., vol. 308–309, Oct. 31, 1997, pp. 19–25.

Gustafsson, G. et al., "Flexible light–emitting diodes made from soluble conducting polymers," Nature, vol. 357, Jun. 11, 1992, pp. 447–479.

Affinito, J.D. et al., "Polymer–Oxide Transparent Barrier Layers," SVC 39th Annual Technical Conference Vacuum Web Coating Session, 1996, pp. 392–397.

Affinito, J.D. et al, "PML/Oxide/PML Barrier Layer Performance Differences Arising From Use of UV or Electron Beam Polymerization of the PML Layers," SVC 40th Annual Technical Conference, 1997, pp. 19–25.

Wong, C.P., "Recent Advances in IC Passivation and Encapsulation: Process Techniques and Materials," Polymers for Electronic and Photonic Applications, AT&T Bell Laboratories, 1993, pp. 167–209.

De Gryse, R. et al., Sputtered Transparent Barrier Layers, pp. 190–198 (no available date).

Tropsha et al., "Activated Rate Theory Treatment of Oxygen and Water Transport through Silicon Oxide/Poly(ethylene terephthalate) Composite Barrier Structures," J. Phys. Chem B 1997, pp. 2259–2266.

Tropsha et al., "Combinatorial Barrier Effect of the Multilayer $SiO_x$ Coatings on Polymer Substrates," 1997 Society of Vacuum Coaters, 40th Annual Technical Conference Proceedings.

Phillips et al., "Evaporated Dielectric Colorless Films on PET and OPP Exhibiting High Barriers Toward Moisture and Oxygen," Society of Vacuum Coaters, 36th Annual Technical Conference Proceedings (1993), pp. 293–300.

Chahroudi, "Transparent Glass Barrier Coatings for Flexible Film Packaging," Society of Vacuum Coaters, 34th Annual Technical Conference Proceedings (1991), pp. 130–133.

Yamada et al., "The Properties of a New Transparent and Colorless Barrier Film," Society of Vacuum Coaters, 38th Annual Technical Conference Proceedings (1995), pp. 28–31.

* cited by examiner

PLASMA ENHANCED CHEMICAL DEPOSITION WITH LOW VAPOR PRESSURE COMPOUNDS

This application is a continuation in part of application Ser. No. 08/939,594, entitled "Plasma Enhanced Chemical Deposition With Low Vapor Pressure Compounds," filed Sep. 29, 1997, now U.S. Pat. No. 6,224,948, issued May 1, 2001.

FIELD OF THE INVENTION

The present invention relates generally to a method of making plasma polymerized films. More specifically, the present invention relates to making a plasma polymerized film via plasma enhanced chemical deposition with a flash evaporated feed source of a low vapor pressure compound.

As used herein, the term "(meth)acrylic" is defined as "acrylic or methacrylic." Also, "(meth)acrylate" is defined as "acrylate or methacrylate".

As used herein, the term "cryocondense" and forms thereof refers to the physical phenomenon of a phase change from a gas phase to a liquid phase upon the gas contacting a surface having a temperature lower than a dew point of the gas.

As used herein, the term "polymer precursor" includes monomers, oligomers, and resins, and combinations thereof. As used herein, the term "monomer" is defined as a molecule of simple structure and low molecular weight that is capable of combining with a number of like or unlike molecules to form a polymer. Examples include, but are not limited to, simple acrylate molecules, for example, hexanedioldiacrylate, and tetraethyleneglycoldiacrylate, styrene, methyl styrene, and combinations thereof. The molecular weight of monomers is generally less than 1000, while for fluorinated monomers, it is generally less than 2000. Substructures such as $CH_3$, t-butyl, and CN can also be included. Monomers may be combined to form oligomers and resins but do not combine to form other monomers.

As used herein, the term "oligomer" is defined as a compound molecule of at least two monomers that may be cured by radiation, such as ultraviolet, electron beam, or x-ray, glow discharge ionization, and spontaneous thermally induced curing. Oligomers include low molecular weight resins. Low molecular weight is defined herein as about 1000 to about 20,000 exclusive of fluorinated monomers. Oligomers are usually liquid or easily liquifiable. Oligomers do not combine to form monomers.

As used herein, the term "resin" is defined as a compound having a higher molecular weight (generally greater than 20,000) which is generally solid with no definite melting point. Examples include, but are not limited to, polystyrene resins, epoxy polyamine resins, phenolic resins, and acrylic resins (for example, polymethylmethacrylate), and combinations thereof.

BACKGROUND OF THE INVENTION

The basic process of plasma enhanced chemical vapor deposition (PECVD) is described in THIN FILM PROCESSES, J. L. Vossen, W. Kern, editors, Academic Press, 1978, Part IV, Chapter IV—1 Plasma Deposition of Inorganic Compounds, Chapter IV—2 Glow Discharge Polymerization, incorporated herein by reference. Briefly, a glow discharge plasma is generated on an electrode that may be smooth or have pointed projections. Traditionally, a gas inlet introduces high vapor pressure monomeric gases into the plasma region wherein radicals are formed so that upon subsequent collisions with the substrate, some of the radicals in the monomers chemically bond or cross link (cure) on the substrate. The high vapor pressure monomeric gases include gases of $CH_4$, $SiH_4$, $C_2H_6$, $C_2H_2$, or gases generated from high vapor pressure liquid, for example styrene (10 torr at 87.4° F. (30.8° C.)), hexane (100 torr at 60.4° F. (15.8° C.)), tetramethyldisiloxane (10 torr at 82.9° F. (28.3° C.)), and 1,3,-dichlorotetramethyldisiloxane (75 torr at 44.6° F. (7.0° C.)), and combinations thereof that may be evaporated with mild controlled heating. Because these high vapor pressure monomeric gases do not readily cryocondense at ambient or elevated temperatures, deposition rates are low (a few tenths of micrometer/min maximum) relying on radicals chemically bonding to the surface of interest instead of cryocondensation. Remission due to etching of the surface of interest by the plasma competes with cryocondensation. Lower vapor pressure species have not been used in PECVD because heating the higher molecular weight monomers to a temperature sufficient to vaporize them generally causes a reaction prior to vaporization, or metering of the gas becomes difficult to control, either of which is inoperative.

The basic process of flash evaporation is described in U.S. Pat. No. 4,954,371 incorporated herein by reference. This basic process may also be referred to as polymer multi-layer (PML) flash evaporation. Briefly, a radiation polymerizable and/or cross linkable material is supplied at a temperature below a decomposition temperature and polymerization temperature of the material. The material is atomized to droplets having a droplet size ranging from about 1 to about 50 microns. An ultrasonic atomizer is generally used. The droplets are then flash vaporized, under vacuum, by contact with a heated surface above the boiling point of the material, but below the temperature which would cause pyrolysis. The vapor is cryocondensed on a substrate, then radiation polymerized or cross linked as a very thin polymer layer.

The material may include a base polymer precursor or mixture thereof, cross-linking agents and/or initiating agents. A disadvantage of flash evaporation is that it requires two sequential steps, cryocondensation followed by curing or cross linking, that are both spatially and temporally separate.

According to the state of the art of making plasma polymerized films, PECVD and flash evaporation or glow discharge plasma deposition and flash evaporation have not been used in combination. However, plasma treatment of a substrate using glow discharge plasma generator with inorganic compounds has been used in combination with flash evaporation under a low pressure (vacuum) atmosphere as reported in J. D. Affinito, M. E. Gross, C. A. Coronado, and P. M. Martin, "Vacuum Deposition Of Polymer Electrolytes On Flexible Substrates," Proceedings of the Ninth International Conference on Vacuum Web Coating, November 1995 ed. R. Bakish, Bakish Press 1995, pg 20–36, and as shown in FIG. 1. In that system, the plasma generator 100 is used to etch the surface 102 of a moving substrate 104 in preparation to receive the monomeric gaseous output from the flash evaporation 106 that cryocondenses on the etched surface 102 and is then passed by a first curing station (not shown), for example electron beam or ultra-violet radiation, to initiate cross linking and curing. The plasma generator 100 has a housing 108 with a gas inlet 110. The gas may be oxygen, nitrogen, water or an inert gas, for example argon, or combinations thereof. Internally, an electrode 112 that is smooth or having one or more pointed projections 114 produces a glow discharge and makes a plasma with the gas which etches the surface 102. The flash evaporator 106 has a housing 116, with a polymer precursor inlet 118 and an atomizing nozzle 120, for example an ultrasonic atomizer. Flow through the nozzle 120 is atomized into particles or droplets 122 which strike the heated surface 124 whereupon the particles or droplets 122 are flash evaporated into a gas that flows past a series of baffles 126 (optional) to an outlet 128 and cryocondenses on the surface 102. Although other gas flow distribution arrangements have been used, it has been found that the baffles 126 provide adequate gas flow distribution or uniformity while permitting ease of scaling up to large surfaces 102. A curing station (not shown) is located downstream of the flash evaporator 106.

Therefore, there is a need for a method for making plasma polymerized layers at a fast rate but that is also self curing, avoiding the need for a curing station.

SUMMARY OF THE INVENTION

The present invention involves a method for plasma enhanced chemical vapor deposition of low vapor pressure polymer precursor materials onto a substrate, and a method for making self-curing polymer layers, especially self-curing PML polymer layers. The invention is a combination of flash evaporation with plasma enhanced chemical vapor deposition (PECVD) that provides the unexpected improvements of permitting the use of low vapor pressure polymer precursor materials in a PECVD process and provides a self curing from a flash evaporation process, at a rate surprisingly faster than standard PECVD deposition rates.

The method of the present invention includes flash evaporating a liquid polymer precursor from an evaporate outlet forming an evaporate, passing the evaporate to a glow discharge electrode creating a glow discharge polymer precursor plasma from the evaporate, and cryocondensing the glow discharge polymer precursor plasma on a substrate as a cryocondensed polymer precursor layer, and crosslinking the cryocondensed polymer precursor layer thereon, the crosslinking resulting from radicals created in the glow discharge polymer precursor plasma.

Accordingly, the present invention provides a method combining flash evaporation with glow discharge plasma deposition.

DETAILED DESCRIPTION OF THE INVENTION

Figure 1:
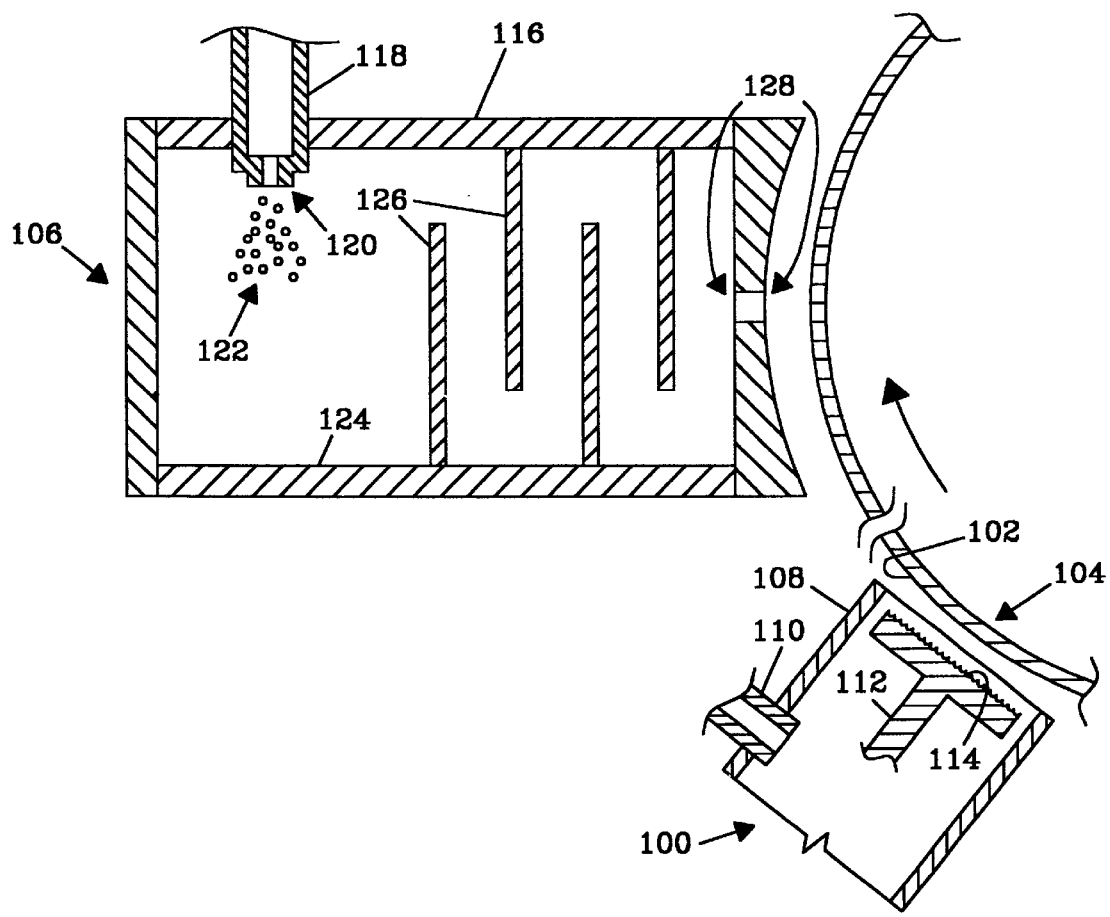
FIG. 1 is a cross section of a prior art combination of a glow discharge plasma generator with inorganic compounds with flash evaporation.
Figure 2:
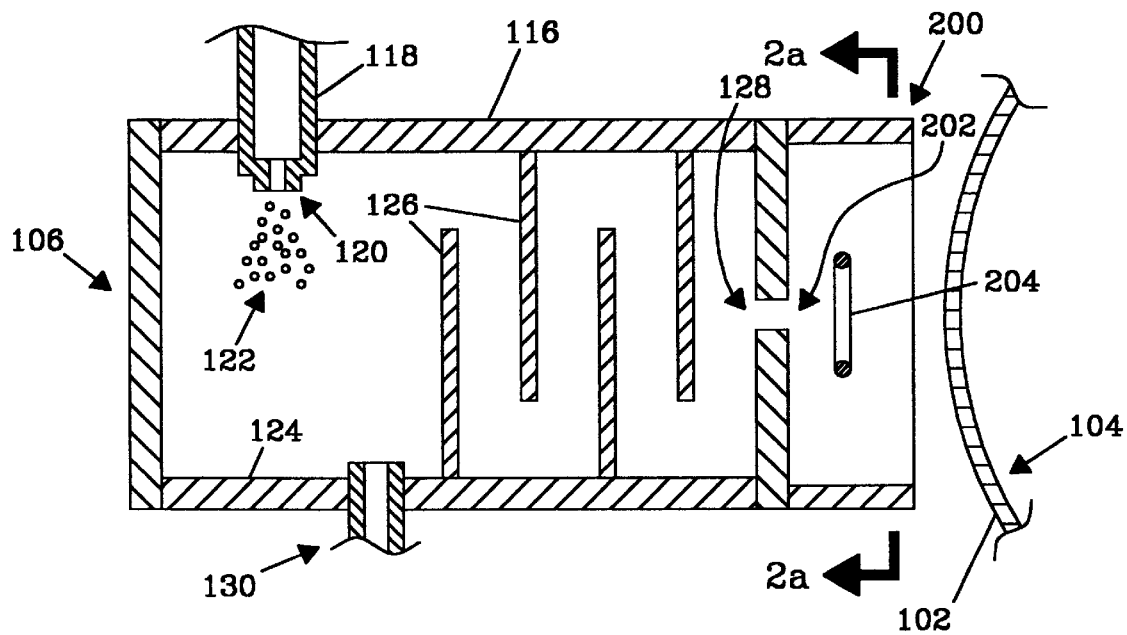
FIG. 2 is a cross section of the apparatus of the present invention of combined flash evaporation and glow discharge plasma deposition.

An apparatus suitable for use in the method is shown in FIG. 2. The method of the present invention may be performed within a low pressure (vacuum) environment or chamber. Pressures typically range from about $10^{-1}$ torr to $10^{-6}$ torr, although lower or higher pressures may be used if desired. The flash evaporator 106 has a housing 116, with a polymer precursor inlet 118 and an atomizing nozzle 120. Flow through the nozzle 120 is atomized into particles or droplets 122 which strike the heated surface 124 whereupon the particles or droplets 122 are flash evaporated into a gas or evaporate that flows past a series of baffles 126 to an evaporate outlet 128 and cryocondenses on the surface 102. Cryocondensation on the baffles 126 and other internal surfaces is prevented by heating the baffles 126 and other surfaces to a temperature in excess of a cryocondensation temperature or dew point of the evaporate. Although other gas flow distribution arrangements can be used, it has been found that the baffles 126 provide adequate gas flow distribution or uniformity while permitting ease of scaling up to large surfaces 102. The evaporate outlet 128 directs gas toward a glow discharge electrode 204 creating a glow discharge plasma from the evaporate. In the embodiment shown in FIG. 2, the glow discharge electrode 204 is placed in a glow discharge housing 200 having an evaporate inlet 202 proximate the evaporate outlet 128. In this embodiment, the glow discharge housing 200 and the glow discharge electrode 204 are maintained at a temperature above a dew point of the evaporate. The glow discharge plasma exits the glow discharge housing 200 and cryocondenses on the surface 102 of the substrate 104. It is preferred that the substrate 104 is kept at a temperature below a dew point of the evaporate, preferably ambient temperature or cooled below ambient temperature to enhance the cryocondensation rate. In this embodiment, the substrate 104 is moving and may be non-electrically conductive, electrically conductive, or electrically biased with an impressed voltage to draw charged species from the glow discharge plasma. If the substrate 104 is electrically biased, it may even replace the electrode 204 and be, itself, the electrode which creates the glow discharge plasma from the polymer precursor gas. Substantially not electrically biased means that there is no impressed voltage, although a charge may build up due to static electricity or due to interaction with the plasma.

Figure 2A:
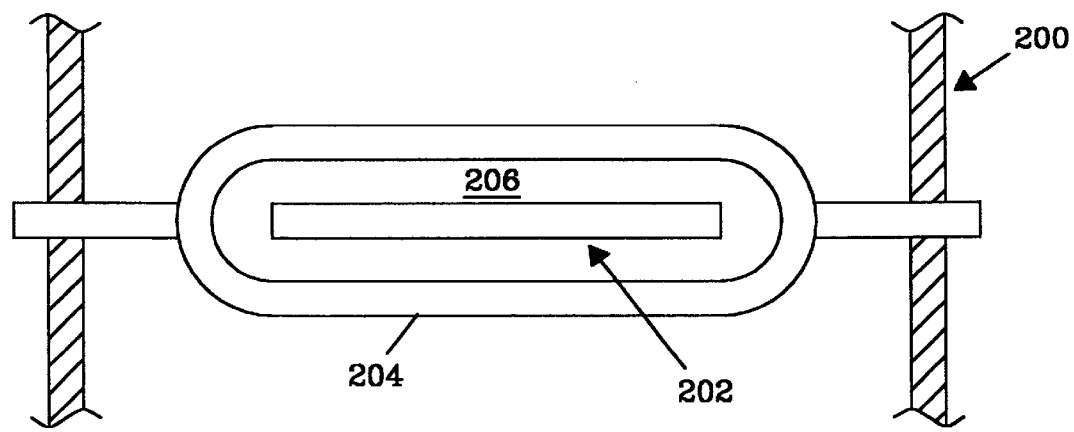
FIG. 2a is a cross section end view of the apparatus of the present invention.

A preferred shape of the glow discharge electrode 204 is shown in FIG. 2a. In this embodiment, the glow discharge electrode 204 is separate from the substrate 104 and shaped so that evaporate flow from the evaporate inlet 202 substantially flows through an electrode opening 206. Any electrode shape can be used to create the glow discharge. The preferred shape of the electrode 204 does not shadow the plasma from the evaporate issuing from the outlet 202, and its symmetry, relative to the polymer precursor exit slit 202 and substrate 104, provides uniformity of the evaporate vapor flow to the plasma across the width of the substrate, while uniformity transverse to the width follows from the substrate motion.

The spacing of the electrode 204 from the substrate 104 is a gap or distance that permits the plasma to impinge upon the substrate. This distance that the plasma extends from the electrode will depend on the evaporate species, electrode 204/substrate 104 geometry, electrical voltage and frequency, and pressure in the standard way as described in detail in ELECTRICAL DISCHARGES IN GASSES, F. M. Penning, Gordon and Breach Science Publishers, 1965, and summarized in THIN FILM PROCESSES, J. L. Vossen, W. Kern, editors, Academic Press, 1978, Part II, Chapter II—1, Glow Discharge Sputter Deposition, both hereby incorporated by reference.

Figure 3:
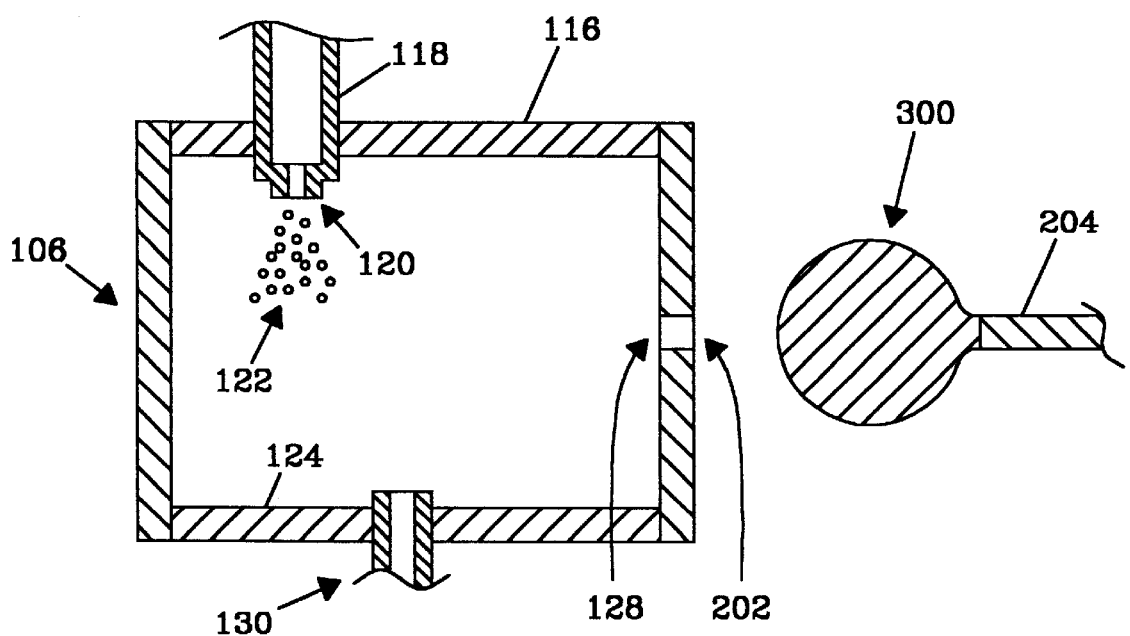
FIG. 3 is a cross section of the present invention wherein the substrate is the electrode.

An apparatus suitable for batch operation is shown in FIG. 3. In this embodiment, the glow discharge electrode 204 is sufficiently proximate a part 300 (substrate) that the part 300 is an extension of or part of the electrode 204. Moreover, the part is below a dew point to allow cryocondensation of the glow discharge plasma on the part 300 and thereby coat the part 300 with the polymer precursor condensate and self cure into a polymer layer. Sufficiently proximate may be connected to, resting upon, in direct contact with, or separated by a gap or distance that permits the plasma to impinge upon the substrate. This distance that the plasma extends from the electrode will depend on the evaporate species, electrode 204/substrate 104 geometry, electrical voltage and frequency, and pressure in the standard way as described in ELECTRICAL DISCHARGES IN GASSES. The substrate 300 may be stationary or moving during cryocondensation. Moving includes rotation and translation and may be employed for controlling the thickness and uniformity of the polymer precursor layer cryocondensed thereon. Because the cryocondensation occurs rapidly, within milli-seconds to seconds, the part may be removed after coating and before it exceeds a coating temperature limit.

In operation, either as a method for plasma enhanced chemical vapor deposition of low vapor pressure polymer precursor materials onto a substrate, or as a method for making self-curing polymer layers (especially PML), the method of the invention includes flash evaporating a liquid polymer precursor from an evaporate outlet forming an evaporate, passing the evaporate to a glow discharge electrode creating a glow discharge polymer precursor plasma from the evaporate, and cryocondensing the glow discharge polymer precursor plasma on a substrate as a cryocondensed polymer precursor and crosslinking the cryocondensed polymer precursor thereon, the crosslinking resulting from radicals created in the glow discharge polymer precursor plasma.

The flash evaporating may be performed by supplying a continuous liquid flow of the polymer precursor into a vacuum environment at a temperature below both the decomposition temperature and the polymerization temperature of the polymer precursor, continuously atomizing the polymer precursor into a continuous flow of droplets, and continuously vaporizing the droplets by continuously contacting the droplets on a heated surface having a temperature at or above a boiling point of the liquid polymer precursor, but below a pyrolysis temperature, forming the evaporate. The droplets typically range in size from about 1 micrometer to about 50 micrometers, but they could be smaller or larger.

Alternatively, the flash evaporating may be performed by supplying a continuous liquid flow of the polymer precursor into a vacuum environment at a temperature below both the decomposition temperature and the polymerization temperature of the polymer precursor, and continuously directly vaporizing the liquid flow of the polymer precursor by continuously contacting the liquid polymer precursor on a heated surface having a temperature at or above the boiling point of the liquid polymer precursor, but below the pyrolysis temperature, forming the evaporate. This may be done using the vaporizer disclosed in U.S. Pat. Nos. 5,402,314, 5,536,323, and 5,711,816, which are incorporated herein by reference.

The liquid polymer precursor may be any liquid polymer precursor useful in flash evaporation for making polymer films. The polymer precursor material or liquid may have a low vapor pressure at ambient temperatures so that it will readily cryocondense. The vapor pressure of the polymer precursor material may be less than about 10 torr at 83° F. (28.3° C.), less than about 1 torr at 83° F. (28.3° C.), or less than about 10 millitorr at 83° F. (28.3° C.). For polymer precursors of the same chemical family, polymer precursors with low vapor pressures usually also have higher molecular weight and are more readily cryocondensible than higher vapor pressure, lower molecular weight polymer precursors.

The polymer precursors may be monomers, oligomers, or resins, and combinations thereof. Examples of monomers include, but are not limited to, (meth)acrylate molecules, for example, hexanedioldiacrylate, and tetraethyleneglycoldiacrylate, styrene, and methyl styrene, and combinations thereof. Oligomers, include, but are not limited to, polyethylene glycol diacrylate 200, polyethylene glycol diacrylate 400, and polyethylene glycol diacrylate 600, tripropyleneglycol diacrylate, tetraethylene glycol diacrylate, tripropylene glycol monoacrylate, and caprolactone acrylate, and combinations thereof. Resins include, but are not limited to, polystyrene resins, epoxy polyamine resins, phenolic resins, and (meth)acrylic resins, and combinations thereof. The (meth)acrylic polymer precursors are particularly useful in making molecularly doped polymers (MDP), light emitting polymers (LEP), and light emitting electrochemical cells (LEC).

By using flash evaporation, the polymer precursor is vaporized so quickly that reactions which generally occur from heating a liquid polymer precursor to an evaporation temperature simply do not occur. Further, control of the rate of evaporate delivery is strictly controlled by the rate of liquid polymer precursor delivery to the inlet 118 of the flash evaporator 106.

In addition to the evaporate from the liquid polymer precursor, additional gases may be added within the flash evaporator 106 through a gas inlet 130 upstream of the evaporate outlet 128, preferably between the heated surface 124 and the first baffle 126 nearest the heated surface 124. Additional gases may be organic or inorganic for purposes including, but not limited to, ballast, reaction and combinations thereof. Ballast refers to providing sufficient molecules to keep the plasma lit in circumstances of low evaporate flow rate. Reaction refers to chemical reaction to form a compound different from the evaporate. Ballast gases include, but are not limited to, group VIII of the periodic table, hydrogen, oxygen, nitrogen, chlorine, bromine, and polyatomic gases including, for example, carbon dioxide, carbon monoxide, or water vapor, and combinations thereof. An exemplary reaction is by addition of oxygen gas to the polymer precursor evaporate hexamethyldisiloxane to obtain silicon dioxide.

EXAMPLE 1

An experiment was conducted to demonstrate the present invention as shown in FIG. 2 and described above. Tetraethyleneglycoldiacrylate was used as the liquid polymer precursor. The heated surface was set at a temperature of about 650° F. (343° C.). Liquid polymer precursor was introduced to the inlet via a capillary with 0.032 inch I.D. The ultrasonic atomizer had a tip with 0.051 inch I.D. Rate of deposition of the polymer layer was 0.5 m/min for 25 micron thick polymer layer and 100 m/min for 1 micron thick polymer layer. Visual inspection of the cured polymer layer did not reveal any pin holes or other flaw.

The present invention is insensitive to the direction of motion of the substrate because the deposited polymer precursor layer is self curing. In the prior art, the deposited polymer precursor layer required a radiation curing apparatus so that the motion of the substrate had to be from the place of deposition toward the radiation apparatus. In addition, multiple layers of materials may be combined using the present invention. For example, as recited in U.S. Pat. Nos. 5,547,508 and 5,395,644, 5,260,095, hereby incorporated by reference, multiple polymer layers, alternating layers of polymer and metal, and other layers may be made with the present invention in the vacuum environment.

We claim:

1. A method for plasma enhanced chemical vapor deposition of a polymer precursor onto a substrate in a vacuum environment, comprising:
   (a) making an evaporate by receiving the polymer precursor as a spray into a flash evaporation housing, evaporating the spray on an evaporation surface, and discharging the evaporate through an evaporate outlet;
   (b) making a polymer precursor plasma from the evaporate by passing the evaporate proximate a glow discharge electrode; and
   (c) cryocondensing the polymer precursor plasma onto the substrate as a cryocondensed polymer precursor layer.

2. The method as recited in claim 1, wherein the substrate is proximate the glow discharge electrode, and is electrically biased with an impressed voltage.

3. The method as recited in claim 1, wherein the glow discharge electrode is positioned within a glow discharge housing having an evaporate inlet proximate the evaporate outlet, the glow discharge housing and the glow discharge electrode maintained at a temperature above a dew point of the evaporate, and the substrate is downstream of the polymer precursor plasma, and is substantially not electrically biased with an impressed voltage.

4. The method as recited in claim 1, wherein the polymer precursor is selected from (meth)acrylate polymer precursors, styrene polymer precursors, and methyl styrene polymer precursors, epoxy polyamine polymer precursors, and phenolic polymer precursors, and combinations thereof.

5. The method as recited in claim 4, wherein the polymer precursor is a (meth)acrylate polymer precursor selected from polyethylene glycol diacrylate 200, polyethylene glycol diacrylate 400, polyethylene glycol diacrylate 600, tripropyleneglycol diacrylate, tetraethylene glycol diacrylate, tripropylene glycol monoacrylate, and caprolactone acrylate, and combinations thereof.

6. The method as recited in claim 1, wherein the polymer precursor comprises polymethylmethacrylate.

7. The method as recited in claim 1, wherein the substrate is cooled.

8. The method as recited in claim 1, further comprising adding an additional gas to the evaporate.

9. The method as recited in claim 8, wherein the additional gas is a ballast gas.

10. The method as recited in claim 8, wherein the additional gas is a reaction gas.

11. The method as recited in claim 10, wherein the reaction gas is oxygen gas and the evaporate includes hexamethyldisiloxane.

12. A method for making self-curing polymer layers in a vacuum chamber, comprising:
   (a) flash evaporating a polymer precursor forming an evaporate;
   (b) passing the evaporate to a glow discharge electrode creating a glow discharge polymer precursor plasma from the evaporate; and
   (c) cryocondensing the glow discharge polymer precursor plasma on a substrate as a cryocondensed polymer precursor layer and crosslinking the cryocondensed polymer precursor layer thereon, the crosslinking resulting from radicals created in the glow discharge polymer precursor plasma.

13. The method as recited in claim 12, wherein the substrate is proximate the glow discharge electrode, and is electrically biased with an impressed voltage.

14. The method as recited in claim 12, wherein the glow discharge electrode is positioned within a glow discharge housing having an evaporate inlet proximate the evaporate outlet, the glow discharge housing and the glow discharge electrode maintained at a temperature above a dew point of the evaporate, and the substrate is downstream of the polymer precursor plasma, and is substantially not biased with an impressed voltage.

15. The method as recited in claim 12, wherein the polymer precursor is selected from (meth)acrylate polymer precursors, styrene polymer precursors, and methyl styrene polymer precursors, epoxy polyamine polymer precursors, and phenolic polymer precursors, and combinations thereof.

16. The method as recited in claim 15, wherein the polymer precursor is a (meth)acrylate polymer precursor selected from polyethylene glycol diacrylate 200, polyethylene glycol diacrylate 400, polyethylene glycol diacrylate 600, tripropyleneglycol diacrylate, tetraethylene glycol diacrylate, tripropylene glycol monoacrylate, and caprolactone acrylate, and combinations thereof.

17. The method as recited in claim 12, wherein the polymer precursor comprises polymethylmethacrylate.

18. The method as recited in claim 12, wherein the substrate is cooled.

19. The method as recited in claim 12, wherein the vapor pressure of the polymer precursor is less than about 10 torr at 83° F. (28.3° C.).

20. The method as recited in claim 12, wherein the vapor pressure of the polymer precursor is less than about 1 torr at 83° F. (28.3° C.).

21. The method as recited in claim 12, wherein the vapor pressure of the polymer precursor is less than about 10 millitorr at 83° F. (28.3° C.).

22. The method as recited in claim 12, wherein flash evaporating comprises:
   supplying a continuous liquid flow of the polymer precursor into a vacuum environment at a temperature below both the decomposition temperature and the polymerization temperature of the polymer precursor;
   continuously atomizing the polymer precursor into a continuous flow of droplets; and
   continuously vaporizing the droplets by continuously contacting the droplets on a heated surface having a temperature at or above a boiling point of the polymer precursor, but below a pyrolysis temperature, forming the evaporate.

23. The method as recited in claim 22 wherein the droplets range in size from about 1 micrometer to about 50 micrometers.

24. The method as recited in claim 12 wherein flash evaporating comprises:
   supplying a continuous liquid flow of the polymer precursor into a vacuum environment at a temperature below both the decomposition temperature and the polymerization temperature of the polymer precursor; and
   continuously directly vaporizing the liquid flow of the polymer precursor by continuously contacting the polymer precursor on a heated surface having a temperature at or above a boiling point of the polymer precursor, but below a pyrolysis temperature, forming the evaporate.

* * * * *